(12) United States Patent
Ohuchi

(10) Patent No.: US 6,229,222 B1
(45) Date of Patent: May 8, 2001

(54) SEMICONDUCTOR DEVICE AND METHOD OF FABRICATING THE SAME

(75) Inventor: Shinji Ohuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/140,662

(22) Filed: Aug. 26, 1998

(30) Foreign Application Priority Data

Jun. 9, 1998 (JP) .................................................. 10-160686

(51) Int. Cl.[7] .................................................. H01L 23/28
(52) U.S. Cl. .................... 257/787; 738/737; 738/780; 738/786
(58) Field of Search .................... 257/787, 738, 257/737, 780, 786

(56) References Cited

U.S. PATENT DOCUMENTS

| 5,668,405 | * | 9/1997 | Yamashita | 257/737 |
| 5,844,304 | * | 12/1998 | Kata et al. | 257/737 |
| 5,866,475 | * | 2/1999 | Yanagida | 438/613 |
| 5,933,752 | * | 8/1999 | Yanagida | 438/613 |
| 5,995,379 | * | 11/1999 | Kyougoku et al. | 257/686 |
| 6,008,543 | * | 12/1999 | Iwabuchi | 257/737 |
| 6,028,356 | * | 2/2000 | Kimura | 257/730 |

FOREIGN PATENT DOCUMENTS

| 3-104141 | 5/1995 | (JP) . |
| 8-64725 | 3/1996 | (JP) . |

* cited by examiner

*Primary Examiner*—David Hardy
*Assistant Examiner*—Lourdes Cruz
(74) *Attorney, Agent, or Firm*—Jones Volentine, L.L.C.

(57) ABSTRACT

Second electrode pads are formed in a circuit forming region in a surface of a semiconductor chip so as to be electrically connected to first electrode pads formed in an electrode pad region, respectively. The surface of the semiconductor chip is coated with a sealing resin layer and second bumps are formed on the surface of the sealing resin layer so as to be electrically connected to the second electrode pads, respectively.

19 Claims, 6 Drawing Sheets

SEMICONDUCTOR DEVICE AND METHOD OF FABRICATING THE SAME

BACKGROUND OF THE INVENTION

1. Field of the Invention

The present invention relates to a semiconductor device and, more particularly, to a semiconductor device having a semiconductor chip having a surface provided with at least an electronic circuit and a resin sealing hermetically sealing the surface of the semiconductor chip.

2. Description of the Related Art

Semiconductor devices have been used in various fields. Reduction in device dimensions and weight, and device miniaturization have been required of semiconductor devices applied to portable devices, such as IC cards, portable telephone sets, portable game machines and portable personal computers, and such reduction and miniaturization has progressively become important in recent years with the diffusion of portable devices. Various semiconductor devices have been proposed to meet such a demand in, for example:

Cited reference 1: JP-A No. 3-104141

Cited reference 2: JP-A No. 8-064725

In a semiconductor device proposed in Cited reference 1, projections connected to the pads of an IC chip project from a plastic molding generally sealing the IC chip. In a semiconductor device proposed in Cited reference 2, bumps or Au balls are formed on pads arranged in the periphery of a semiconductor chip, respectively, so that the bumps or the Au balls are exposed on the surface of a plastic molding.

It is known from those cited references that the semiconductor chip of the semiconductor device is provided on its surface with an electronic circuit. Signals are exchanged between the electronic circuit of the semiconductor chip and an external device, such as a wiring board on which the semiconductor chip is mounted, through bumps and electrode pads formed on the surface of the semiconductor chip; that is, the electrode pads are electrically connected to the electronic circuit formed on the surface of the semiconductor chip and the bumps to which external devices apply signals.

The surface of the semiconductor chip of the semiconductor device is divided into a circuit forming region in which the electronic circuit is formed, and an electrode pad region in which the electrode pads electrically connected to the electronic circuit and to the bumps through which signals are exchanged between the electronic circuit and external devices. The circuit forming region is in a central part of the surface of the semiconductor chip, and the electrode pad region is in a peripheral part of the surface extending along the sides of the semiconductor chip, i.e., a part surrounding the circuit forming region. The circuit forming region and the electrode pad region are thus arranged to facilitate work for connecting the electrode pads to the bumps and to avoid adversely affecting the electronic circuit when scribing a wafer to divide the wafer into semiconductor chips.

Generally, the bumps of the semiconductor device are formed at standardized positions. Therefore, it is difficult to form the bumps at desired positions when the semiconductor chip is miniaturized to meet the miniaturization of the semiconductor device. For example, when using a semiconductor device disclosed in Cited reference 1 or 2, the semiconductor device may be mounted on a wiring board provided with electrode pads corresponding to the respective positions of the bumps of the semiconductor device, and bumps electrically connected to the electrode pads formed in a standard arrangement.

Such a method of mounting the semiconductor device on the wiring board provided with the electrode pads and the bumps in a standard arrangement needs an additional wiring board, and hence increases the cost. Furthermore, since the completed semiconductor device is connected to the additional wiring board to construct a new semiconductor device, a complicated semiconductor device fabricating process is necessary, and additional problems are liable to arise due to the faulty connection of the semiconductor device and the additional wiring board and the separation of the semiconductor device from the additional wiring board.

SUMMARY OF THE INVENTION

Accordingly, it is a principal object of the present invention to solve those problems in the prior art and to provide a semiconductor device meeting demand for miniaturization and weight reduction without entailing increase in cost.

Another object of the present invention is to provide a semiconductor device meeting demand for miniaturization and weight reduction and having a sufficient strength.

A third object of the present invention is to provide a semiconductor device meeting demand for miniaturization and weight reduction and not reducing the degree of freedom of designing the layout of an electronic circuit formed on a semiconductor chip included therein.

A fourth object of the present invention is to provide a semiconductor device capable of being fabricated by a simple semiconductor device fabricating method.

With the foregoing object in view, according to a fist aspect of the present invention, a semiconductor device comprises: a semiconductor chip having a surface having a circuit forming region provided with an electronic circuit, and an electrode pad region surrounding the circuit forming region and provided with a plurality of first electrode pads electrically connected to the electronic circuit formed in the circuit forming region; a plurality of second electrode pads formed in the circuit forming region in the surface of the semiconductor chip and electrically connected respectively to the corresponding first electrode pads; a resin layer formed on the surface of the semiconductor chip to seal the surface of the semiconductor chip; and a plurality of bumps of a conductive material projecting from the resin layer and electrically connected respectively to the corresponding second electrode pads.

According to the present invention, the bumps may be covered with a metal.

According to the present invention, the back surface of the semiconductor chip may be coated with an insulating material, such as an insulating tape.

According to the present invention, the first and the second electrode pads may electrically be connected by a wiring layer formed on the surface of the semiconductor chip or by wires.

According to the present invention, the circuit forming region in the surface of the semiconductor chip may be covered with a protective layer of an insulating material, and the second electrode pads may be formed on the protective layer.

According to a second aspect of the present invention, a method of fabricating a semiconductor device comprising a semiconductor chip having a surface having a circuit forming region provided with an electronic circuit, and an electrode pad region surrounding the circuit forming region and provided with a plurality of first electrode pads electrically connected to the electronic circuit formed in the circuit forming region comprises: forming the plurality of first electrode pads in the electrode pad region in the surface of the semiconductor chip; forming a plurality of second electrode pads in the circuit forming region in the surface of the semiconductor chip; forming a wiring layer electrically connecting the first electrode pads and the second electrode pads on the surface of the semiconductor chip; forming first bumps on the second electrode pads; and forming a sealing resin layer on the surface of the semiconductor chip so that the semiconductor chip can send signals to and can receive signals from external devices through the first bumps.

According to the present invention, second bumps may be formed on the first bumps before or after the step of forming the sealing resin layer on the surface of the semiconductor chip.

According to a third aspect of the present invention, a method of fabricating a semiconductor device comprising a semiconductor chip having a surface having a circuit forming region provided with an electronic circuit, and an electrode pad region surrounding the circuit forming region and provided with a plurality of first electrode pads electrically connected to the electronic circuit formed in the circuit forming region comprises: forming the plurality of first electrode pads in the electrode pad region; forming a plurality of second electrode pads in the circuit forming region; forming first bumps on the second electrodes; electrically connecting the first electrode pads and the first bumps by wires; forming second bumps on the first bumps so that each of the wires is held between the first bump and the second bump; and forming a sealing resin layer on the surface of the semiconductor chip so that at least part of each of the second bumps is exposed thereon.

According to the present invention, the circuit forming region in the surface of the semiconductor chip may be coated with a protective layer of an insulating material before the step of forming the second electrode pads, and the second electrode pads may be formed on the protective layer.

According to the present invention, the second bumps may be coated with a metal after the step of forming the sealing resin layer on the surface of the semiconductor chip.

According to the present invention, the back surface of the semiconductor chip may be covered with an insulating tape.

DETAILED DESCRIPTION OF THE PREFERRED EMBODIMENTS

Preferred embodiments of the present invention will be described hereinafter with reference to the accompanying drawings.

Figure 1:
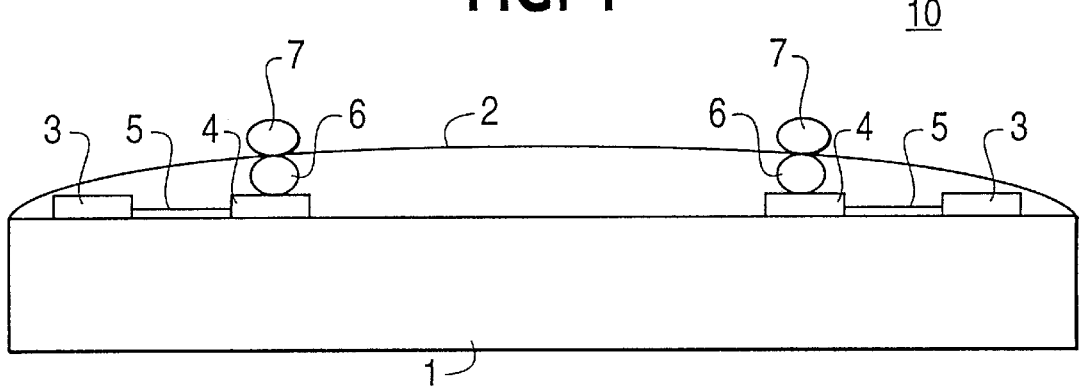
FIG. 1 is a typical sectional view of a semiconductor device 10 in a first embodiment according to the present invention.
Figure 2:
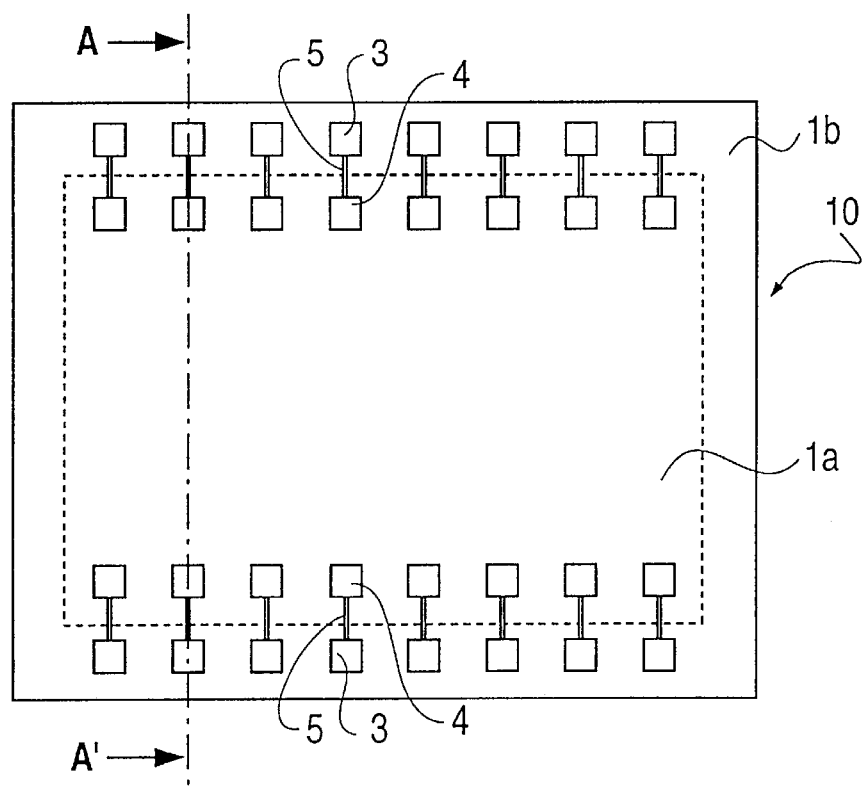
FIG. 2 is a top plan view of the semiconductor device 10 of FIG. 1.

Referring to FIGS. 1 and 2 showing a semiconductor device 10 in a first embodiment according to the present invention, a semiconductor chip 1 is provided with an electronic circuit in a circuit forming region 1a, ie., a central region surrounded by dotted lines, of its surface. First electrode pads 3, ie., main electrode pads, are formed in an electrode pad region 1b, i.e., a peripheral region surrounding the circuit forming region 1a, in the surface of the semiconductor chip 1 and are electrically connected to the electronic circuit formed in the circuit forming region 1a in the surface of the semiconductor chip 1. Second electrode pads 4, ie., auxiliary electrode pads, are formed in the circuit forming region 1a in which the electronic circuit is formed. The first electrode pads 3 and the second electrode pads 4 are electrically connected by wiring line 5, respectively, of a wiring layer formed on the surface of the semiconductor chip 1.

Referring to FIG. 2, the plurality of first electrode pads 3 are arranged in the electrode pad region 1b, and the second electrode pads 4 are arranged opposite to the first electrode pads 3, respectively, in the circuit forming region 1a. The first electrode pads 3 and the corresponding second electrode pads 4 are electrically connected by the wiring line 5, respectively. FIG. 1 is a sectional view taken on line A–A' in FIG. 2. Although the first electrode pads 3 are arranged along the two sides of the semiconductor chip 1 in this embodiment, the first electrode pads 3 may otherwise be arranged. For example, the first electrode pads 3 may be arranged along the four sides of the semiconductor chip 1 or may be arranged along only one of the four sides of the semiconductor chip 1. Some electronic elements and wiring lines may be formed in the electrode pad region 1b provided that the first electrode pads 3 can be arranged as shown in FIG. 2.

Shown also in FIG. 1 are first bumps 6, second bumps 7, and a sealing resin layer 2 covering the surface of the semiconductor chip 1 to protect the electronic circuit and such formed on the surface of the semiconductor chip 1 from detrimental external actions, such as shocks and moisture. The sealing resin layer 2 is formed so that at least a part of each of the second bumps is exposed on the surface of the sealing resin layer 2. The electronic circuit formed on the surface of the semiconductor chip 1 of the semiconductor device 10 sends signals to and receives signals from external devices through the second bumps 7, the second electrode pads 4, the wiring lines 5 and the first electrode pads 3.

The second bumps 7 may be omitted and the first bumps 6 may partly be exposed on the sealing resin layer 2. However, the area of parts of the first bumps exposed on the sealing resin layer 2 is small if the sealing resin layer 2 is formed in a thickness sufficient to protect the surface of the semiconductor chip 1. Therefore, the second bumps 7 are electrically connected to the first bumps 6 as connecting electrodes having a sufficiently large area. The second bumps 7 facilitate the electrical connection of the semiconductor device 10 to an external device when mounting the semiconductor device 10 on the external device.

Since the second electrode pads 4 are formed in the circuit forming region 1a, it is possible that the electronic circuit is connected accidentally to the second electrode pads 4. A thin insulating film is formed at least over the circuit forming region in the surface of the semiconductor chip 1 and the second electrode pads 4 are formed on the insulating film to avoid the accidental electrical connection of the electronic circuit to the second electrode pads 4. If the thin insulating film is formed so as to cover the entire surface of the semiconductor chip 1, the first electrode pads 3 and the wiring lines 5 may be formed on the thin insulating film, or the thin insulating film may be formed over the first electrode pads 3 and the second electrode pads 4, contact holes may be formed in the thin insulating film, and the first electrode pads 3 and the second electrode pads 4 may electrically be connected through the contact holes by the wiring lines 5 formed on the thin insulating film.

In the semiconductor device 10 in the first embodiment thus formed, the second electrode pads 4 may be formed at optional positions on the surface of the semiconductor chip 1. Therefore, the respective positions of the second electrode pads 4 can readily be determined so as to correspond to the standard positions of bumps even if the size of the semiconductor chip 1 is reduced to meet conditions for the miniaturization of the semiconductor device 10. Since the thickness of the semiconductor device 10 is substantially equal to the sum of those of the semiconductor chip 1 and the sealing resin layer 2, and the sealing resin layer 2 is formed only on one of the major surfaces of the semiconductor chip 1, the semiconductor device 10 can be formed in lightweight construction of a small thickness. Since the semiconductor device 10 comprises, as principal components, only the semiconductor chip 1, the bumps 6 and 7 and the sealing resin layer 2, and does not need any substrate and such, the semiconductor device 10 can be fabricated at a low cost.

A semiconductor device 20 in a second embodiment according to the present invention will be described with reference to FIG. 3 similar to FIG. 1, in which parts like or corresponding to those of the semiconductor device 10 in the first embodiment are designated by the same reference characters.

Figure 3:
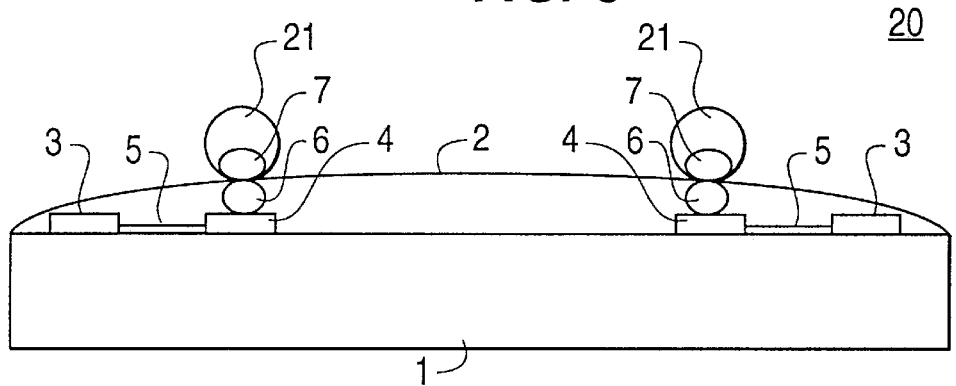
FIG. 3 is a typical sectional view of a semiconductor device 20 in a second embodiment according to the present invention.

Referring to FIG. 3, the semiconductor device 20 is provided with second bumps 7 covered with solder balls 21, ie., metal balls. The semiconductor device 20 in the second embodiment is the same in other respects as the semiconductor device 10 in the first embodiment. The solder balls 21 substantially increase the effective area of the second bumps 7 of the semiconductor device 20 to be connected to terminals of an external device, such as terminals formed on a wiring board and increase the bonding strength of joints of the second bumps 7 and the terminals of the external device. If the semiconductor device 20 is greatly different in coefficient of thermal expansion from the external device, such as a wiring board, the solder balls 21 reduce stress induced in the joints of the second bumps 7 and the terminals of the external device due to the difference in coefficient of thermal expansion between the semiconductor device 20 and the external device. Balls of a metal may be used instead of the solder balls 21, provided that the balls are able to cover the second bumps 7.

A semiconductor device 30 in a third embodiment according to the present invention will be described with reference to FIG. 4 similar to FIG. 1, in which parts like or corresponding to those of the semiconductor device 20 in the second embodiment are designated by the same reference characters.

Figure 4:
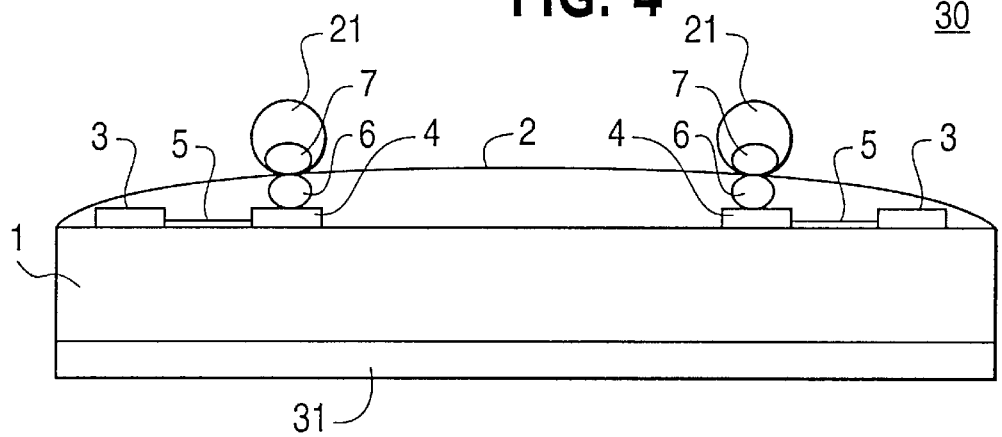
FIG. 4 is a typical sectional view of a semiconductor device 30 in a third embodiment according to the present invention.

Referring to FIG. 4, the semiconductor device 30 has a semiconductor chip 1 having a back surface coated with an insulating film 31. In this embodiment, the insulating film 31 is a resin tape. The semiconductor device 30 in the third embodiment is the same in other respects as the semiconductor device 20 in the second embodiment.

The insulating film 31 coating the back surface of the semiconductor chip 1 protects the semiconductor chip 1 from defects and warping due to the effects of external factors, such as heat and forces exerted on the semiconductor chip 1, during the process of fabricating the semiconductor device 30 and after mounting the semiconductor device 30 on an external device. If an electronic circuit and wiring lines are formed on the back surface of the semiconductor chip 1, the insulating film 31 protects the electronic circuit and the wiring lines from detrimental external factors, such as shocks and moisture exerted on the semiconductor device 30. If the insulating film 31 is an insulating tape, the insulating film 31 can easily be attached to the back surface of the semiconductor chip 1. Although the semiconductor device 30 shown in FIG. 4 is provided with the second bumps 7 covered with solder balls 21, ie., metal balls, the solder balls 21 are not necessarily essential to the third embodiment. If the solder balls 21 are omitted from the semiconductor device 30 shown in FIG. 4, the effects of the first embodiment and those of the insulating film 31 of the third embodiment can be exercised.

Although the insulating film 31 increases the thickness of the semiconductor device 30, the difference between the thickness of the semiconductor device 30 in the third embodiment and that of the semiconductor device 10 in the first embodiment or the semiconductor device 20 in the second embodiment is insignificant.

Figure 5:
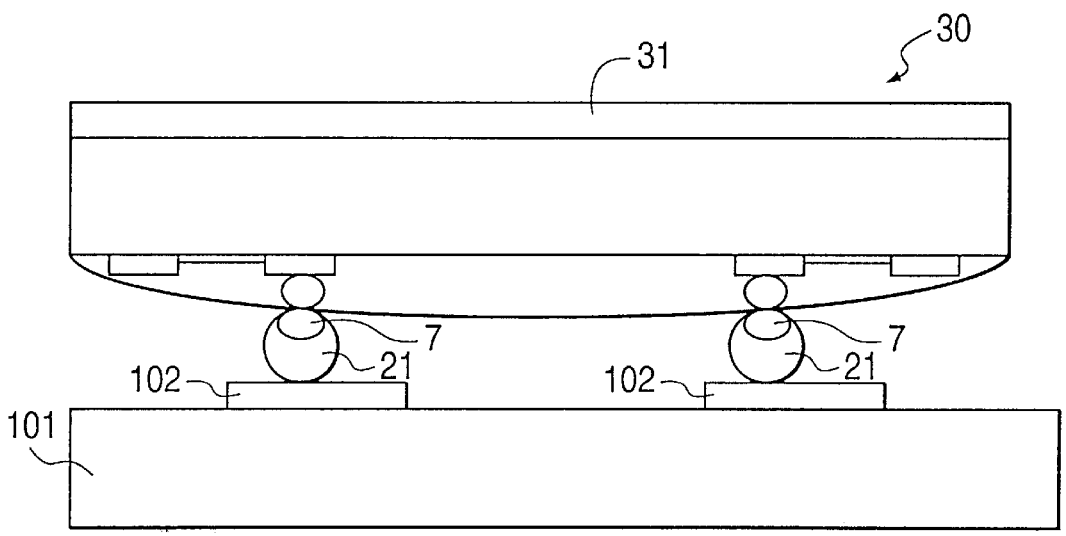
FIG. 5 is a typical sectional view of the semiconductor device 30 of FIG. 4 as mounted on an external device.

FIG. 5 shows the semiconductor device 30 in the third embodiment as mounted on a printed wiring board 101, ie., an external device. As shown in FIG. 5, the semiconductor device 30 is disposed opposite to the printed wiring board 101 with the surface provided with the solder balls 21 facing a surface of the printed wiring board 101 provided with printed electrodes 102, the solder balls 21 are connected electrically to the printed electrodes 102, respectively, of the printed wiring board 101 to fix the semiconductor device 30 to the printed wiring board 101 and to connect the electronic circuit of the semiconductor chip 1 of the semiconductor device 30 to other external devices mounted on the printed wiring board 101. The electronic circuit of the semiconductor chip 1 of the semiconductor device 30 sends signals to and receive signals from the external devices through the solder balls 21 and the printed electrodes 102. When mounting the semiconductor device 10 in the first embodiment not provided with any solder balls on the printed wiring board 101, the second bumps 7 are connected to the printed electrodes 102, respectively. The semiconductor device 20 in the second embodiment not provided with any film corresponding to the insulating film 31, similarly to the semiconductor device 30 in the third embodiment, can be mounted on the printed wiring board 101 as illustrated in FIG. 5.

A method of fabricating the semiconductor device 30 in the third embodiment will be described with reference to FIGS. 6(A) to 6(G).

Figure 6A:
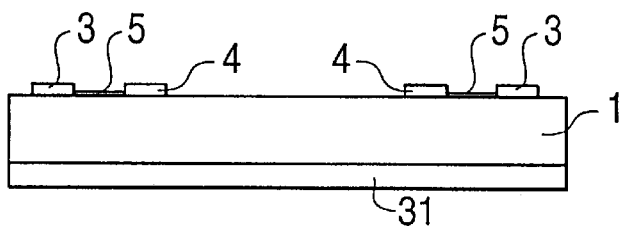
FIGS. 6(A) to 6(G) are typical sectional views of a workpiece in different steps of a method of fabricating the semiconductor device 30 in the third embodiment.

A plurality of semiconductor chips 1 are formed on a wafer. First electrode pads 3, second electrode pads 4 and wiring lines 5 are formed on the surfaces of the semiconductor chips 1, and an insulating film 31 is attached to the back surface of the wafer. Although the insulating film 31 may be attached later to the back surface of the wafer, the insulating film 31 is attached to the back surface of the wafer in this earlier process to prevent the semiconductor chips 1 from warping and being damaged in the following process and to attach the insulating film 31 easily to the plurality of semiconductor chips 1. The wafer is subjected to a dicing process to cut the wafer into the plurality of semiconductor chips 1. FIG. 6(A) shows one of the semiconductor chips 1 obtained by dicing the wafer.

Figure 6B:
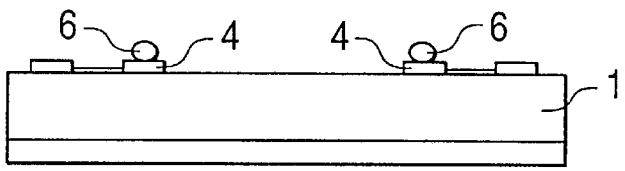

Then, as shown in FIG. 6(B), first bumps 6 are formed so as to be electrically connected to the second electrode pads 4 by a generally known method of forming bumps for wire bonding.

Figure 6C:
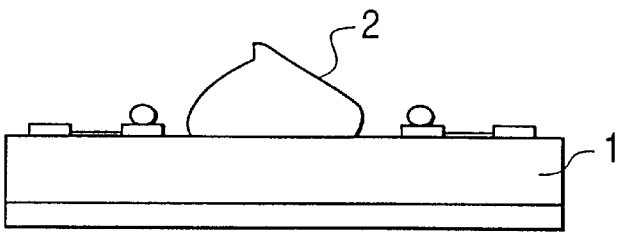
Figure 6D:
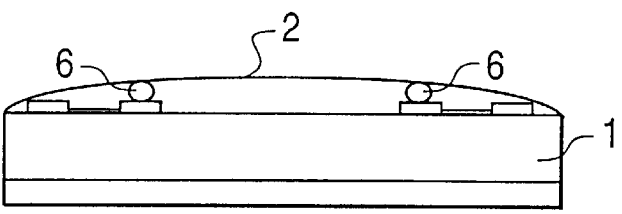

As shown in FIG. 6(C), a drop of a fluid resin for forming a sealing resin layer 2 is dropped on a substantially central region of the surface of the semiconductor chip 1, and the semiconductor chip 1 is kept stationary for a time to allow the drop of fluid resin to spread to form the sealing resin layer 2 or the semiconductor chip 1 is rotated to make the drop of the fluid resin spread forcibly by centrifugal force on the surface of the semiconductor chip 1 to form the sealing resin layer 2. Rotation of the semiconductor chip 1 is able to spread the drop of the fluid resin more quickly and uniformly over the surface of the semiconductor chip 1 than keeping the same stationary. The resin spread over the surface of the semiconductor chip 1 is cured at a predetermined temperature to form the sealing resin layer 2 as shown in FIG. 6(D). The quantity of the drop of the fluid resin dropped on the surface of the semiconductor chip 1 as shown in FIG. 6(C) must be determined so that the first bumps 6 are partly exposed on the surface of the sealing resin layer 2 in a state shown in FIG. 6(D).

Figure 6E:
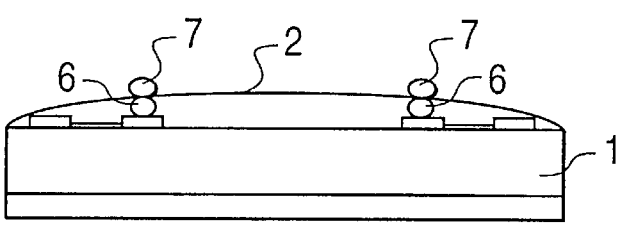

As shown in FIG. 6(E), second bumps 7 are formed so as to be electrically connected to the exposed parts of the first bumps 6, respectively, by a method similar that of forming the first bumps 6.

Figure 6F:
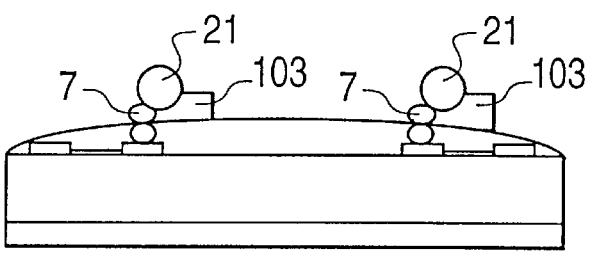
Figure 6G:
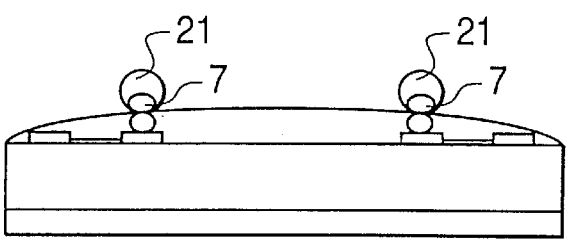

Then as shown in FIG. 6(F), solder balls 21 with flux 103 are formed contiguously with the second bumps 7. The solder balls 21 can be disposed contiguously with the second bumps 7 by the surface tension of the flux 103. Subsequently, the semiconductor chip 1 is subjected to a reflow soldering process at a temperature on the order of 200° C. to complete a semiconductor device 30 as shown in FIG. 6(G). Consequently, the second bumps 7 are covered with the solder balls 21 as shown in FIG. 6(G).

When fabricating the semiconductor device 10 in the first embodiment not provided with any ball corresponding to the solder balls 21, the processes shown in FIGS. 6(F) and 6(G) are omitted When fabricating the semiconductor device 20 in the second embodiment not provided with any film corresponding to the insulating film 31, the insulating film 31 is not attached to the semiconductor chip 1 in the process shown in FIG. 6(A).

The semiconductor device 30 in the third embodiment may be fabricated by a method other than the method illustrated in FIGS. 6(A) to 6(G). FIGS. 7(A) to 7(G) illustrate another possible method of fabricating the semiconductor device 30 in the third embodiment.

Figure 7A:
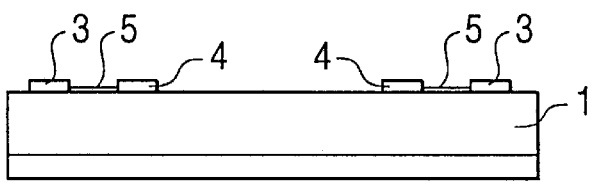
FIGS. 7(A) to 7(G) are typical sectional views of a workpiece in different steps of another method of fabricating the semiconductor device 30 in the third embodiment.
Figure 7B:
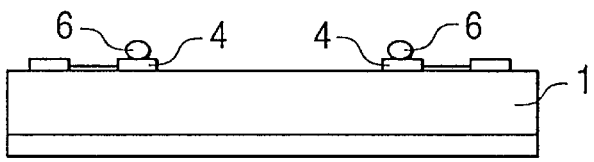

Processes illustrated in FIGS. 7(A) and 7(B), which are the same as those illustrated in FIGS. 6(A) and 6(B), respectively, are carried out to attach an insulating film 31 to the back surface of a semiconductor chip 1 and to form first bumps 6 electrically connected to second electrode pads 4.

Figure 7C:
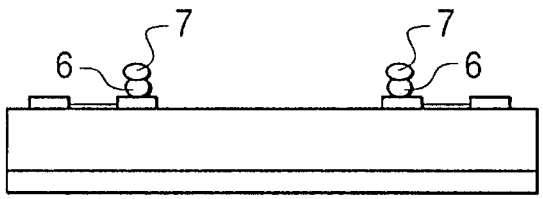
Figure 7D:
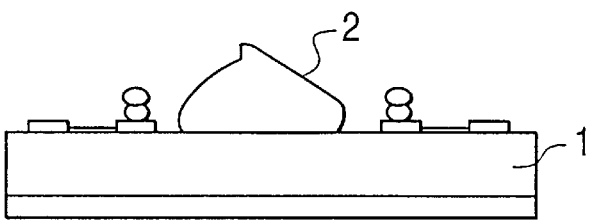
Figure 7E:
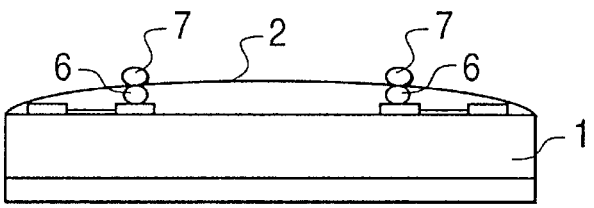

As show in FIG. 7(C), second bumps 7 are formed on the first bumps 6 so as to be electrically connected to the first bumps 6, respectively. In FIG. 7(D), a drop of a fluid resin for forming an sealing resin layer 2 is dropped on a substantially central region of the surface of the semiconductor chip 1, the drop of fluid resin is spread over the surface of the semiconductor chip 1 to form the sealing resin layer 2. The resin spread over the surface of the semiconductor chip 1 is cured at a predetermined temperature to form the sealing resin layer 2 as shown in FIG. 7(E). The quantity of the drop of the fluid resin dropped on the surface of the semiconductor chip 1 as shown in FIG. 7(D) must be determined so that the first bumps 6 are partly exposed on the surface of the sealing resin layer 2 in a state shown in FIG. 7(E). Processes illustrated in FIGS. 7(F) and 7(G) are the same as those illustrated in FIGS. 6(F) and 6(G), respectively.

The method of fabricating the semiconductor device 30 in the third embodiment, illustrated in FIGS. 7(A) to 7(G) forms the second bumps 7 electrically connected to the first bumps 6 before the resin is spread and the sealing resin layer 2 is formed. Accordingly, part of the second bumps 7 electrically connected to the first bumps 6 is surely exposed on the surface of the sealing resin layer 2 even if an excessive quantity of the resin is used for forming the sealing resin layer 2. The method illustrated in FIGS. 7(A) to 7(G), as compared with the method illustrated in FIGS. 6(A) to 6(G), needs less work for adjusting the quantity of the resin to be applied to the surface of the semiconductor chip 1 to form the sealing resin layer 2.

Figure 7F:
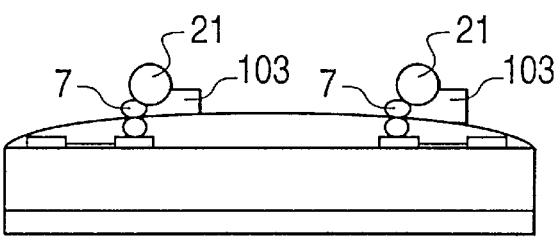
Figure 7G:
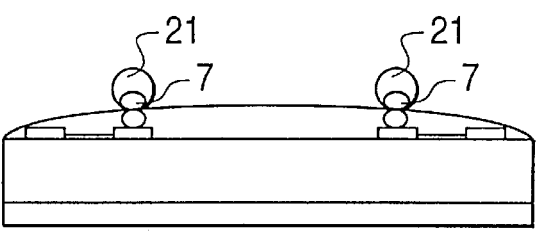

When the method illustrated in FIGS. 7(A) to 7(G) is applied to fabricating the semiconductor device 10 in the first embodiment not provided with any components corresponding to the solder balls 21, the processes illustrated in FIGS. 7(F) and 7(G) are omitted. When fabricating the semiconductor device 20 in the second embodiment not provided with any film corresponding to the insulating film 31, the insulating film 31 is not attached to the semiconductor chip 1 in the process illustrated in FIG. 7(A).

A semiconductor device 40 in a fourth embodiment according to the present invention will be described with reference to FIG. 8, in which parts like or corresponding to those of the semiconductor device 30 in the third embodiment shown in FIG. 4 are designated by the same reference characters.

Figure 8:
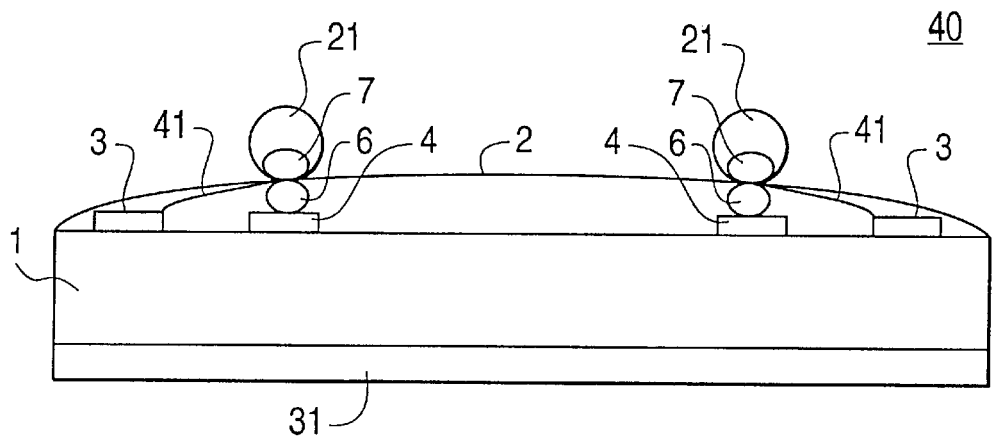
FIG. 8 is a typical sectional view of a semiconductor device 40 in a fourth embodiment according to the present invention.

Referring to FIG. 8, the semiconductor device 40 employs wires 41 instead of the wiring lines 5 for electrically connecting first electrode pads 3 and second electrode pads 4. The semiconductor device 40 is the same in other respects as the semiconductor device 30 shown in FIG. 4. A typical sectional view of the semiconductor device 40 shown in FIG. 8 corresponds to that taken on line A–A' in FIG. 2. As shown in FIG. 8, each of the wires 41 has one end connected to the first electrode pad 3 and the other end connected to the joint of a first bump 6 and a second bump 7.

The semiconductor device 40 in the fourth embodiment employing the wires 41 instead of the wiring lines 5 does not need any process of forming a conductive film for forming the wiring lines 5. The semiconductor device 40 in the fourth embodiment is not subject to restrictions, if any, on the layout of components on the surface of the semiconductor chip 1 due to the necessity of arranging the wiring lines 5 on the surface of the semiconductor chip 1.

A semiconductor device 50 in a fifth embodiment according to the present invention will be described with reference to FIG. 9, in which parts like or corresponding to those of the fourth embodiment are designated by the same reference characters.

Figure 9:
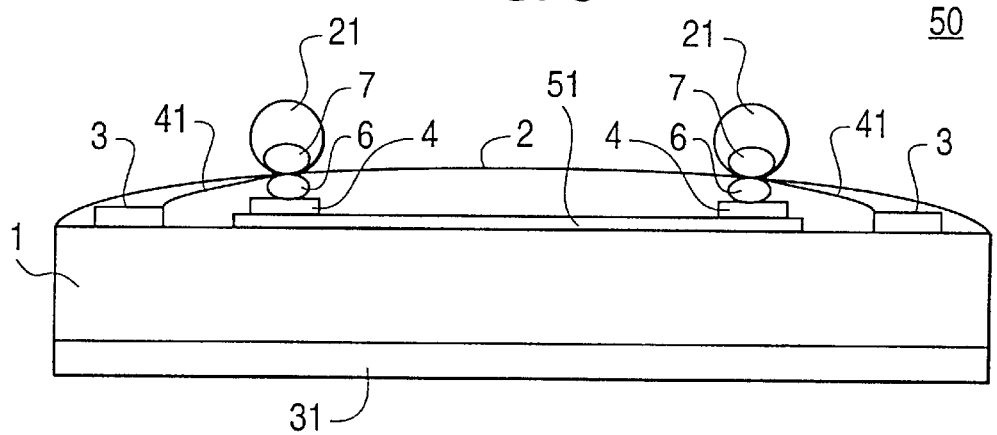
FIG. 9 is a typical sectional view of a semiconductor device 50 in a fifth embodiment according to the present invention.

Referring to FIG. 9, the semiconductor device 50 has a circuit forming region, i.e., a region corresponding to the circuit forming region 1a shown in FIG. 2, coated with a protective layer 51 of an insulating material. Second electrode pads 4 are formed on the protective layer 51. The semiconductor device 50 is the same in other respects as the semiconductor device 40 shown in FIG. 8. A typical sectional view of the semiconductor device 50 shown in FIG. 9 corresponds to that taken on line A–A' in FIG. 2, except that the semiconductor device 50 employs wires 41 instead of the wiring lines 5 shown in FIG. 2. The thickness of the protective layer 51 is relatively great and is greater than that of an insulating film coating the surface of a semiconductor chip 1 included in the semiconductor device 50.

The semiconductor device 50 in the fifth embodiment shown in FIG. 9 exercises effects in addition to those exercised by the semiconductor devices in the first to the fourth embodiment. The protective layer 51 of the semiconductor device 50 prevents the destruction of an electronic circuit formed under the second electrode pads 4 when forming first bumps 6 and second bumps 7 on the second electrode pads 4 because the second electrode pads 4 are formed on the protective layer 51. A part of the semiconductor chip 1 on which the electronic circuit are formed has low tolerance to shocks and is liable to crack. The protective layer 51 absorbs shocks that may be exerted on the semiconductor chip 1 when forming the first bumps 6 and the second bumps 7. The protective film 51 maybe formed over the entire circuit forming region or may be formed over sections of the circuit forming region corresponding to the second electrode pads 4. However, it is preferable to form the protective layer 51 so as to cover the entire circuit forming region entirely because the protective layer 51 formed so as to cover the circuit forming region entirely is able to disperse shocks.

The semiconductor device 40 in the fourth embodiment and the semiconductor device 50 in the fifth embodiment need not necessarily be provided with solder balls 21 and an insulating film 31 as shown in FIGS. 8 and 9. Effects characteristic of the fourth and the fifth embodiment are exercised in addition to the effects characteristic of the first and the second embodiment if the semiconductor devices 40 and 50 are not provided with the insulating film 31. Effects characteristic of the fourth and the fifth embodiment are exercised in addition to the effects of the first embodiment if the semiconductor devices 40 and 50 are provided with neither the solder balls 21 and the insulating film 31.

Figure 10:
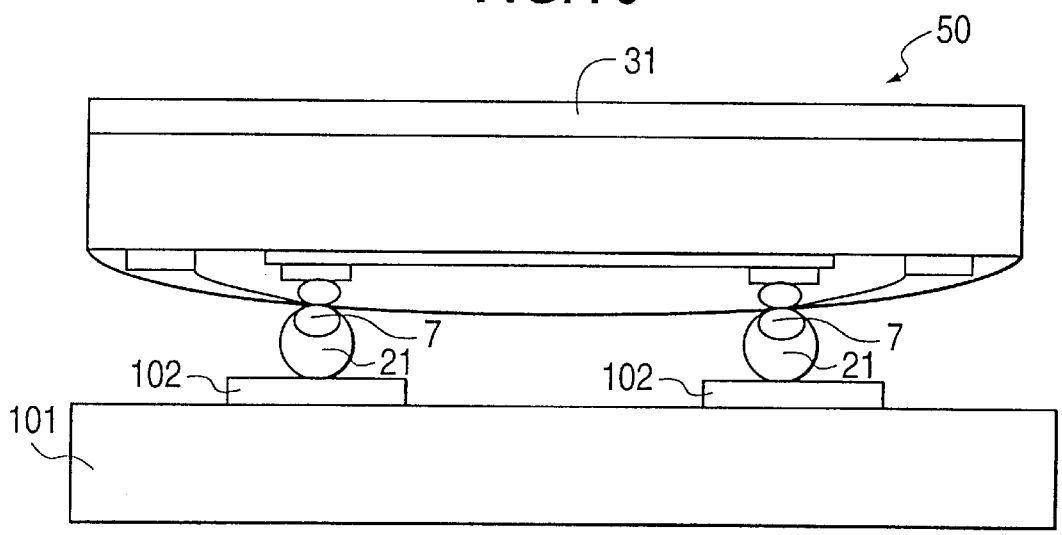
FIG. 10 is a typical sectional view of the semiconductor device 50 of FIG. 9 as mounted on an external device.

Referring to FIG. 10 showing the semiconductor device 50 in the fifth embodiment as mounted on a printed wiring board 101, ie., an external device, the semiconductor device 50 is disposed opposite to the printed wiring board 101 with the surface provided with the solder balls 21 facing a surface of the printed wiring board 101 provided with printed electrodes 102, the solder balls 21 are connected electrically to the printed electrodes 102, respectively, of the printed wiring board 101 to fix the semiconductor device 50 to the printed wiring board 101 and to connect the electronic circuit of the semiconductor chip 1 of the semiconductor device 50 to other external devices mounted on the printed wiring board 101. The electronic circuit of the semiconductor chip 1 of the semiconductor device 50 sends signals to and receives signals from the external devices through the solder balls 21 and the printed electrodes 102. When mounting a semiconductor device not provided with any solder balls on the printed wiring board 101, the second bumps 7 are connected to the printed electrodes 102, respectively. A semiconductor device not provided with any film corresponding to the insulating film 31, similarly to the semiconductor device 50 in the fifth embodiment, can be mounted on the printed wiring board 101 as illustrated in FIG. 10.

A method of fabricating the semiconductor device 50 in the fifth embodiment will be described with reference to FIGS. 11(A) to 11(G).

Figure 11A:
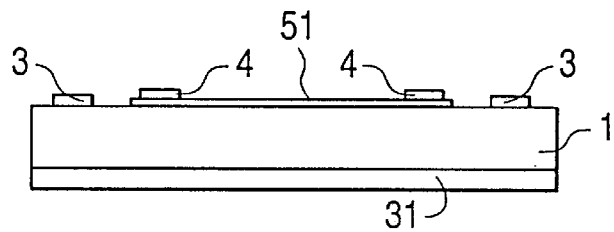
FIGS. 11(A) to 11(G) are typical sectional views of a workpiece in different steps of a method of fabricating the semiconductor device 50 in the fifth embodiment.

A plurality of semiconductor chips 1 are formed on a wafer. First electrode pads 3, protective layer 51 and second electrode pads 4 are formed on the surfaces of the semiconductor chips 1. An insulating film 31 is attached to the back surface of the wafer. Although the insulating film 31 may be attached later to the back surface of the wafer, the insulating film 31 is attached to the back surface of the wafer in this earlier process for reasons previously described with reference to FIG. 6(A). The wafer is subjected to a dicing process to cut the wafer into the plurality of semiconductor chips 1. FIG. 11(A) shows one of the semiconductor chips 1 obtained by dicing the wafer.

The first electrode pads 3 and the second electrode pads 4 may be formed either simultaneously or separately after the protective layer 51 has been formed. The method needs less steps if the first electrode pads 3 and the second electrode pads 4 are formed simultaneously.

Figure 11B:
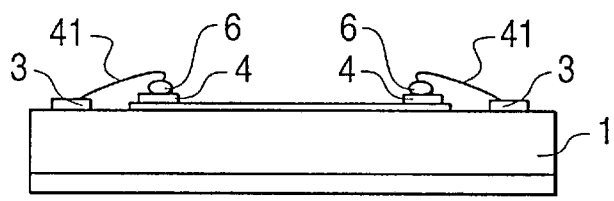

Then, as shown in FIG. 11(B), first bumps 6 are formed so as to be electrically connected to the second electrode pads 4. Then the first bumps 6 are electrically connected to the first electrode pads 3 with wires 41. The first bumps 6 may be formed and the first bumps 6 maybe connected to the electrode pads 3 with the wires 41 by a generally known wire bonding method.

Figure 11C:
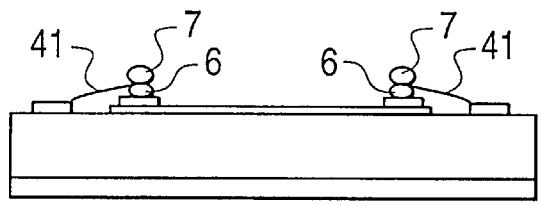

As shown in FIG. 11(C), second bumps 7 are formed on the first bumps 6 so as to be electrically connected to the latter. It is desirable to form the second bumps 7 on the joints of the first bumps 6 and the wires 41 to reinforce the joints of the first bumps 6 and the wires 41. The second bumps 7 may be formed by a general wire bonding method.

Figure 11D:
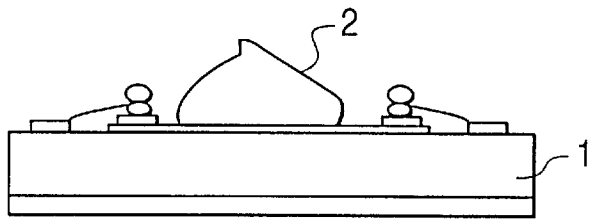
Figure 11E:
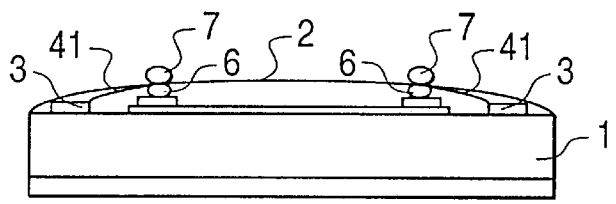

A process similar to that previously explained with reference to FIG. 7(D) is carried out in a step shown in FIG. 11(D), a process similar to that previously explained with reference to FIG. 7(E) is carried out in a step shown in FIG. 11(E), a process similar to that previously explained with reference to FIG. 7(F) is carried out in a step shown in FIG. 11(F), and a process similar to that previously explained with reference to FIG. 7(G) is carried out in a step shown in FIG. 11(F).

The method of fabricating the semiconductor device 50 in the fifth embodiment, illustrated in FIGS. 11(A) to 11(G), similar to those illustrated in FIGS. 6(A) to 6(G) or in FIGS. 7(A) to 7(G), does not need complicated processes, any mold and any new mold. Consequently, the semiconductor device 50 in the fifth embodiment can easily be fabricated without entailing increase in costs. The method illustrated in FIGS. 11(A) to 11(G) forms the second bumps 7 on the joints of the first bumps 6 and the wires 41 as illustrated in FIG. 11(C), and the second bumps 7 prevents the separation of the wires 41 from the first bumps by the application of the resin drop to the semiconductor chip 1 in the process shown in FIG. 11(D) and by the spread of the resin in the process shown in FIG. 11(E).

Figure 11F:
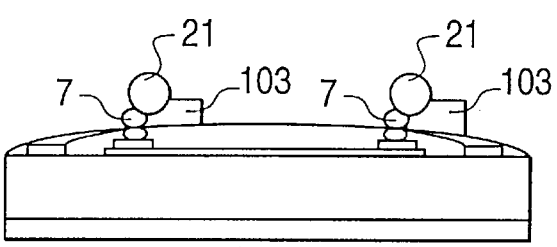
Figure 11G:
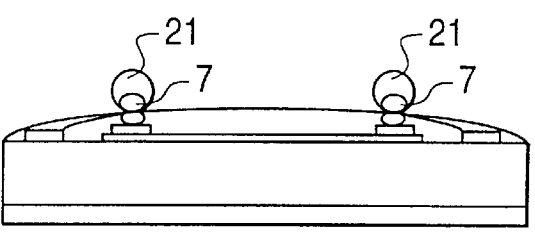

When the method illustrated in FIGS. 11(A) to 11(G) is applied to fabricating a semiconductor device not provided with any parts corresponding to the solder balls 21, the processes shown in FIGS. 11(F) and 11(G) are omitted When the method illustrated in FIGS. 11(A) to 11(G) is applied to fabricating a semiconductor device not provided with any part corresponding to the insulating film 31, the insulating film 31 is not attached to the back surface of the semiconductor chip 1 in the process shown in FIG. 11(A). When the method illustrated in FIGS. 11(A) to 11(G) is applied to fabricating the semiconductor device 40 in the fourth embodiment not provided with any layer corresponding to the protective layer 51, the protective layer 51 is not formed in the process shown in FIG. 11(A).

The wires 41 may be connected to the joints of the second electrode pads 4 and the first bumps 6 instead of being connected to the joints of the first bumps 6 and the second bumps 7. The second electrode pads 4 may be formed after dividing the wafer into individual semiconductor chips 1 by dicing.

Although the invention has been described in its preferred embodiments with a certain degree of particularity, many changes and variations are possible therein. It is therefore to be understood that the present invention may be practiced otherwise than as specifically described herein without departing from the scope and spirit thereof.

What is claimed is:

1. A semiconductor device comprising:
    a semiconductor chip having a surface, the surface having a circuit forming region provided with an electronic circuit, and an electrode pad region surrounding the circuit forming region and provided with a plurality of first electrode pads electrically connected to the electronic circuit formed in the circuit forming region;
    a plurality of second electrode pads placed on the circuit forming region in the surface of said semiconductor chip;
    a plurality of conductive members placed on said second electrode pads, each of said conductive members being electrically connected respectively to corresponding ones of said second electrode pads;
    a plurality of wirings respectively directly connecting corresponding ones of the first electrode pads with corresponding ones of said conductive members; and
    a resin placed on the surface of said semiconductor chip, to cover the surface of said semiconductor chip, the first electrode pads, said second electrode pads, said wirings and portions of said conductive members.

2. The semiconductor device according to claim 1, wherein another surface of said semiconductor chip is coated with an insulating material, the another surface of said semiconductor chip being parallel with the surface of said semiconductor chip.

3. A semiconductor device comprising:
    a semiconductor chip having a surface, the surface having a circuit forming region provided with an electronic circuit, and an electrode pad region surrounding the circuit forming region and provided with a plurality of first electrode pads electrically connected to the electronic circuit formed in the circuit forming region;
    a plurality of second electrode pads placed on the circuit forming region in the surface of said semiconductor chip;
    a plurality of conductive members placed on said second electrode pads, each of said conductive members being electrically connected respectively to corresponding ones of said second electrode pads;
    a plurality of wirings respectively directly connecting corresponding ones of the first electrode pads with corresponding ones of said second electrode pads; and
    a resin placed on the surface of said semiconductor chip, to cover the surface of said semiconductor chip, the first electrode pads, said second electrode pads, said wirings and portions of said conductive members.

4. The semiconductor device according to claim 3, wherein said wirings are conductive thin material placed on the surface of said semiconductor chip.

5. The semiconductor device according to claim 1, wherein the circuit forming region in the surface of said semiconductor chip is covered with a protective layer of an insulating material, and said second electrode pads are placed on the protective layer.

6. The semiconductor device according to claim 1, wherein part of each of said conductive members are exposed through a surface of said resin.

7. The semiconductor device according to claim 6, wherein the semiconductor device has a plurality of bumps which are placed on a surface of said resin, each of said bumps being electrically connected to corresponding ones of said conductive members.

8. The semiconductor device according to claim 7, wherein each of said bumps is covered by metal.

9. The semiconductor device according to claim 8, wherein another surface of said semiconductor chip is coated with an insulating material, the another surface of said semiconductor chip being parallel to the surface of said semiconductor chip.

10. The semiconductor device according to claim 2, wherein a side surface of said semiconductor chip is exposed between said resin and said insulating material.

11. The semiconductor device according to claim 2, wherein said insulating material is tape-like material.

12. The semiconductor device according to claim 1, wherein said conductive members are formed ball-shaped.

13. The semiconductor device according to claim 1, wherein the first electrode pads and said second electrode pads are placed on a same surface of said semiconductor chip.

14. The semiconductor device according to claim 3, wherein another surface of said semiconductor chip is coated with an insulating material, the another surface of said semiconductor chip being parallel with the surface of said semiconductor chip.

15. The semiconductor device according to claim 3, wherein part of each of said conductive members are exposed through a surface of said resin.

16. The semiconductor device according to claim 3, wherein the first electrode pads and said second electrode pads are placed on a same surface of said semiconductor chip.

17. A semiconductor device comprising:
    a semiconductor chip having a surface, the surface having a circuit forming region, said circuit forming region having an electronic circuit therein;
    first electrode pads formed in the surface of the semiconductor chip in an electrode pad region located laterally away from said circuit forming region, said first electrode pads being electrically connected to the electronic circuit;
    second electrode pads formed on the surface of the semiconductor chip in said circuit forming region;
    first conductive members respectively formed on said second electrode pads;
    second conductive members respectively formed on said first conductive members;
    a plurality of wires each respectively having a first end connected to an interface between a corresponding pair of said first and second conductive members and a second end coupled to a corresponding one of said first electrode pads; and a resin that covers the surface of the semiconductor chip including said first and second electrode pads, said first conductive members and said plurality of wires, so that said second conductive members are exposed.

18. A semiconductor device comprising:

a semiconductor chip having a surface, the surface having a circuit forming region, said circuit forming region having an electronic circuit therein;

first electrode pads formed in the surface of the semiconductor chip in an electrode pad region located laterally away from said circuit forming region, said first electrode pads being electrically connected to the electronic circuit;

second electrode pads formed on the surface of the semiconductor chip in said circuit forming region;

first conductive members respectively formed on said second electrode pads;

a plurality of wires each respectively having a first end directly connected to a corresponding one of said first electrode pads and a second end directly connected to a corresponding one of said second electrode pads; and a resin that covers the surface of the semiconductor chip including said first and second electrode pads, said first conductive members and said plurality of wires, so that only respective portions of said first conductive members are exposed.

19. The semiconductor device of claim 18, further comprising:

second conductive members respectively formed on the exposed portions of said first conductive members, so that only said second conductive members are exposed.

* * * * *